(12) United States Patent
Lu et al.

(10) Patent No.: US 8,384,215 B2
(45) Date of Patent: Feb. 26, 2013

(54) WAFER LEVEL MOLDING STRUCTURE

(75) Inventors: Su-Tsai Lu, Hsinchu (TW); Jing-Ye Juang, Hsinchu (TW); Yu-Min Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 183 days.

(21) Appl. No.: 12/981,475

(22) Filed: Dec. 30, 2010

(65) Prior Publication Data

US 2012/0168933 A1 Jul. 5, 2012

(30) Foreign Application Priority Data

Dec. 30, 2010 (TW) ................................ 99146766 A

(51) Int. Cl.
*H01L 23/485* (2006.01)
*H01L 23/496* (2006.01)

(52) U.S. Cl. ......... 257/737; 257/E23.021; 257/E23.067; 257/738; 257/778; 257/723; 257/686; 257/774; 257/773

(58) Field of Classification Search ................... 257/737, 257/738, 778, 777, 723, 724, 728, 686, 685, 257/774, 773, E23.021, E23.067
See application file for complete search history.

(56) References Cited

U.S. PATENT DOCUMENTS

| | | | |
|---|---|---|---|
| 6,841,883 B1 | 1/2005 | Farnworth et al. | |
| 7,088,005 B2 | 8/2006 | Lee | |
| 7,838,337 B2 * | 11/2010 | Marimuthu et al. | 438/110 |
| 7,851,893 B2 * | 12/2010 | Kim et al. | 257/659 |
| 2002/0056906 A1 | 5/2002 | Kajiwara et al. | |
| 2002/0098620 A1 | 7/2002 | Ding et al. | |
| 2004/0224441 A1 | 11/2004 | Saito | |
| 2007/0075435 A1 | 4/2007 | Suminoe et al. | |
| 2007/0105304 A1 * | 5/2007 | Kasai et al. | 438/254 |
| 2008/0108181 A1 * | 5/2008 | Chan et al. | 438/119 |
| 2008/0206926 A1 * | 8/2008 | Sakamoto et al. | 438/110 |
| 2009/0029504 A1 * | 1/2009 | Paik et al. | 438/108 |
| 2009/0075478 A1 * | 3/2009 | Matsui | 438/667 |
| 2009/0115042 A1 * | 5/2009 | Koyanagi | 257/686 |
| 2011/0024888 A1 * | 2/2011 | Pagaila et al. | 257/686 |
| 2011/0204505 A1 * | 8/2011 | Pagaila et al. | 257/686 |
| 2012/0020028 A1 * | 1/2012 | Bachman et al. | 361/719 |
| 2012/0074585 A1 * | 3/2012 | Koo et al. | 257/774 |
| 2012/0104573 A1 * | 5/2012 | Pagaila et al. | 257/659 |
| 2012/0168933 A1 * | 7/2012 | Lu et al. | 257/737 |

* cited by examiner

*Primary Examiner* — A O Williams
(74) *Attorney, Agent, or Firm* — Jianq Chyun IP Office

(57) ABSTRACT

A wafer level molding structure including a first chip, a second chip and an adhesive layer therebetween is provided. The first chip includes a first back side, a first front side and a plurality of lateral sides, and a plurality of first front side bumps are disposed on the first front side. The second chip includes a second back side and a second front side, and a plurality of second back side bumps and second front side bumps are respectively disposed on the second back side and the second front side. A plurality of through electrodes are disposed in the second chip, and electrically connected the second back side bumps to the second front side bumps. Adhesive materials including a plurality of conductive particles cover the lateral sides, and electrically connect the second back side bumps with the first front side bumps.

26 Claims, 16 Drawing Sheets

WAFER LEVEL MOLDING STRUCTURE

CROSS-REFERENCE TO RELATED APPLICATION

This application claims the priority benefit of Taiwan application serial no. 99146766, filed on Dec. 30, 2010. All disclosure of the Taiwan application is incorporated herein by reference.

BACKGROUND

1. Technical Field

The disclosure relates to a wafer level molding structure and a manufacturing method thereof.

2. Related Art

It is one of the most promising solutions to resolve operations of a future large-scale chip to use a three-dimensional (3D) integrated circuit (IC) integration technology to provide a high-density chip packaging technique and achieve high efficiency and low power consumption. Particularly, in applications of data transmission between a flash memory and a controller of a central processing unit (CPU), a flash memory, or a memory card, a performance advantage of a short distance internal bonding path implemented by through-silicon-vias (TSV) is more obvious.

Therefore, in the portable electronic products emphasizing on multifunction and small size, for example, newly designed stacking structures of a solid state disk (SSD) and a dynamic random access memory (DRAM), etc, besides the high speed transmission is strengthened, power consumption of the chip is also reduced. In case of the same number of input/output pins, the required driving power is reduced, and demand for increasing the capacity, performance and I/O pins is synchronously resolved. Moreover, miniaturization of the 3D chip is a primary factor in market application, and main techniques of the 3D chip integration technology include TSV, micro bump contact fabrication, wafer thinning, alignment, bonding and adhesive dispensing.

Since a wafer-on-wafer (WOW) technique still has a problem of insufficient known-good dies (KGD), a whole packaging yield cannot be ameliorated. Therefore, a chip-to-chip (COC) bonding technique and a chip-to-wafer (COW) bonding technique are used to resolve the above problem, and how to assemble and stack the KGDs of a large amount based on the COC and COW bonding technique, confirm a contact yield and reduce the manufacturing cost are main consideration factors.

In a current 3D chip integration technique, the stacking technique is developed towards a pitch level of 10 micrometers (μm) and thin chips with a thickness level below 50 μm. In order to improve productivity and production yield, the bonding technique is gradually changed from the COC bonding technique to the COW packaging technique, and how to improve the bonding yield and reduce the manufacturing cost are still important issues.

FIG. 1 is a structure schematic diagram of the conventional COW packaging technique using an underfilling process. A wafer 120 is located on a carrier 100, and a cushion layer 110 is disposed there between. Each stacked chip structure 122 comprises three layers of chips 130, 140 and 150, which are electrically bonded with the wafer 120 through Cu bumps or Cu/SnAg micro bumps. Then, an underfill filing process and a molding process are performed to form an underfill layer 160 and a molding layer 170. Since the stacking technique is developed towards a pitch level of 10 micrometers (μm) and thin chips with a thickness level below 50 μm, after the underfill filling process, an overflow problem is occurred, which may influence a yield of the COW packing technique.

Since three steps of stacking, underfilling and molding have to be performed, relatively more time is spent on manufacturing processes, which may increase the manufacturing cost. Different materials are used in the underfilling process and the molding process, which may also increase the fabrication cost. Moreover, since the chip stacking structures are electrically connected through metal joints, the thermal expansion mismatch may also decrease the production yield.

FIG. 2 is a structure schematic diagram of the conventional COW packaging technique using a non-flow underfill (NFU) process. A wafer 220 is located on a carrier 200, and a cushion layer 210 is disposed there between. Each stacked chip structure 222 comprises three layers of chips 230, 240 and 250. The three layers of chips 230, 240 and 250 are respectively pre-adhered with NFUs 232, 242 and 252, and are electrically bonded with the wafer 220 through Cu bumps or Cu/SnAg micro bumps. Then, the molding process is performed to form the molding layer 270.

Since the NFU process has to be performed to adhere the NFU material on the chips, and then the steps of stacking and molding are performed, relatively more time is spent on manufacturing processes, which may increase the manufacturing cost. Different materials are used in the NFU adhering process and the molding process, which may also increase the manufacturing cost. Moreover, since the chip stacking structures are electrically connected through metal joints, the thermal expansion mismatch may also decrease the production yield.

SUMMARY

The disclosure is directed to a wafer level molding structure and a manufacturing method thereof.

One of some embodiments of the disclosure provides a molding structure comprising a first chip, a second chip, a plurality of second through electrodes and an adhesive material. The first chip comprises a first back side, a first front side, a plurality of first lateral sides and a plurality of first front side bumps, disposed on the first front side. The second chip comprises a second back side, a second front side, a plurality of second back side bumps, disposed on the second back side, and a plurality of second front side bumps, disposed on the second front side. The plurality of second through electrodes are disposed in the second chip and are used to electrically connect the second back side bumps and the second front side bumps of the second chip. The adhesive material is disposed between the first chip and the second chip and is covering the first lateral sides of the first chip. The first front side bumps of the first chip are electrically connected to the second back side bumps of the second chip.

One of some embodiments provides a packaging structure of a wafer level chip. The packaging structure comprises a substrate, a first chip and a first adhesive layer. The substrate comprises an active surface, where a first patterned conductive layer is located on the active surface. The first chip, connected to the substrate, comprises a first surface, adjacent to the active surface of the substrate, a second patterned conductive layer, located on the first surface, and a second surface. The second patterned conductive layer is electrically connected to the first patterned conductive layer of the substrate. The first adhesive layer, filled between the first chip and the substrate, covers the active surface of the substrate and all surfaces of the first chip besides the second surface, in which a vertical height of the first adhesive layer relative to the active surface of the substrate is equal to a vertical height of the second surface of the first chip relative to the active surface of the substrate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In order to resolve problems occurred during an underfilling process and a molding process of a stacking structure stacked according to a chip-to-wafer (COW) bonding technique, the disclosure provides a solution to simultaneously implement fine pitch underfilling and wafer level molding.

Figure 3A:
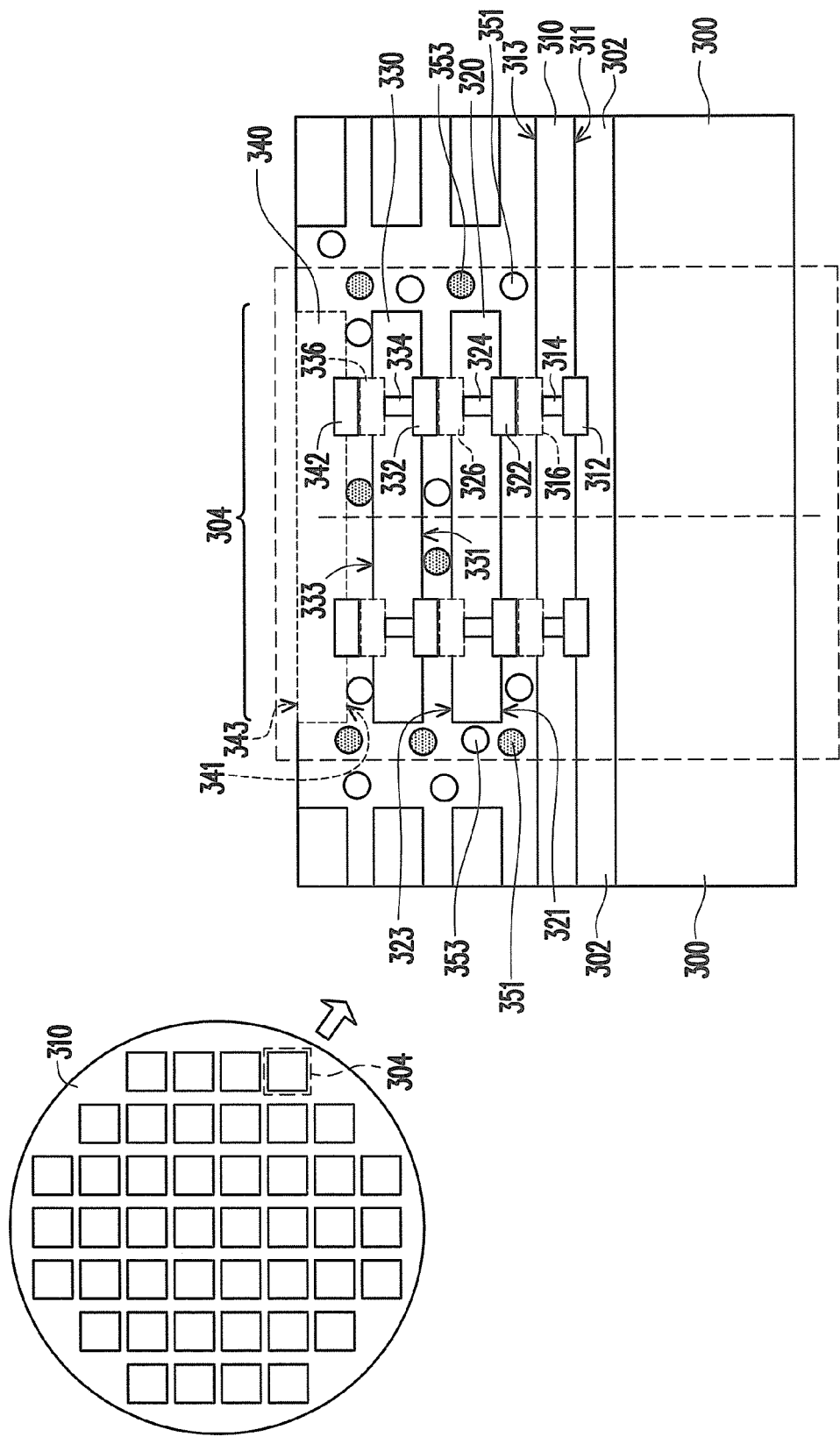
FIG. 3A is a structure schematic diagram of a wafer level molding structure according to an embodiment of the disclosure.

FIG. 3A is a structure schematic diagram of a wafer level molding structure according to an embodiment of the disclosure. A wafer 310 is disposed on a carrier 300, and a cushion layer 302 is disposed there between. The wafer level molding structure 304, located on the wafer 310, comprises three layers of a first chip 320, a second chip 330 and a third chip 340. In the embodiment, the three-layered structure is taken as an example for description, though the disclosure is not limited thereto. A thickness of each of the first, second and third chips 320, 330 and 340 is, for example, smaller than or equal to 100 μm (micrometer) and greater than 5 μm.

The wafer 310 comprises a wafer back side and a wafer front side, and a plurality of back side bumps and a plurality of front side bumps, for example, wafer back side bumps 316 and wafer front side bumps 312 shown in FIG. 3A. A plurality of through electrodes electrically connects the wafer back side bumps and the wafer front side bumps, for example, wafer through electrodes 314 shown in FIG. 3A.

The first, second and third chips 320, 330 and 340 respectively comprise a back side, a front side and a plurality of lateral sides. In one embodiment, a plurality of bumps is disposed on the back sides and the front sides. In one of some embodiments, a plurality of through electrodes electrically connecting the back side bumps and the front side bumps are also included therein. As shown in FIG. 3A, the first chip 320 comprises a plurality of first front side bumps 322 on a first front side 321, a plurality of first through electrodes 324 therein, and a plurality of first back side bumps 326 on a first back side 323. The second chip 330 comprises a plurality of second front side bumps 332 on a second front side 331, a plurality of second through electrodes 334 therein, and a plurality of second back side bumps 336 on a second back side 333. The third chip 340 comprises a plurality of third front side bumps 342 on a third front side 341. The above bumps can be Cu bumps, or Cu/SnAg micro bumps, etc.

An adhesive material 350 may be a polymer adhesive, which comprises a plurality of conductive particles 351 and/or a plurality of non-conductive particles 353. The adhesive material 350 is disposed between the wafer 310 and the first, second and third chips 320, 330 and 340, and covers the lateral sides of the first, second and third chips 320, 330 and 340. When the adhesive material 350 comprises the conductive particles 351, the first, second and third front side bumps 322, 332 and 342 are electrically connected to the wafer back side bumps 316, the first and second back side bumps 326 and 336 through the conductive particles 353, respectively. When the adhesive material 350 does not comprise the conductive particles 351, the first, second and third front side bumps 322, 332 and 342 are electrically connected to the back side bumps 316, the first and second back side bumps 326 and 336 through a contact approach, respectively. The adhesive material 350 comprising the conductive particles 351 may be an anisotropic conductive adhesive (ACA), and the adhesive material 350 not comprising the conductive particles 351 may be a non-conductive adhesive (NCA).

In the whole molding structure 304, regarding an uppermost layer of the stacking structure, for example, the third chip 340, a surface of a third back side 343 of the third chip 340 may be exposed, and in the whole molding structure 304, the surface of the third back side 343 of the chip 340 is aligned to a surface of the adhesive material 350, so as to form the molding structure 304.

Figure 3B:
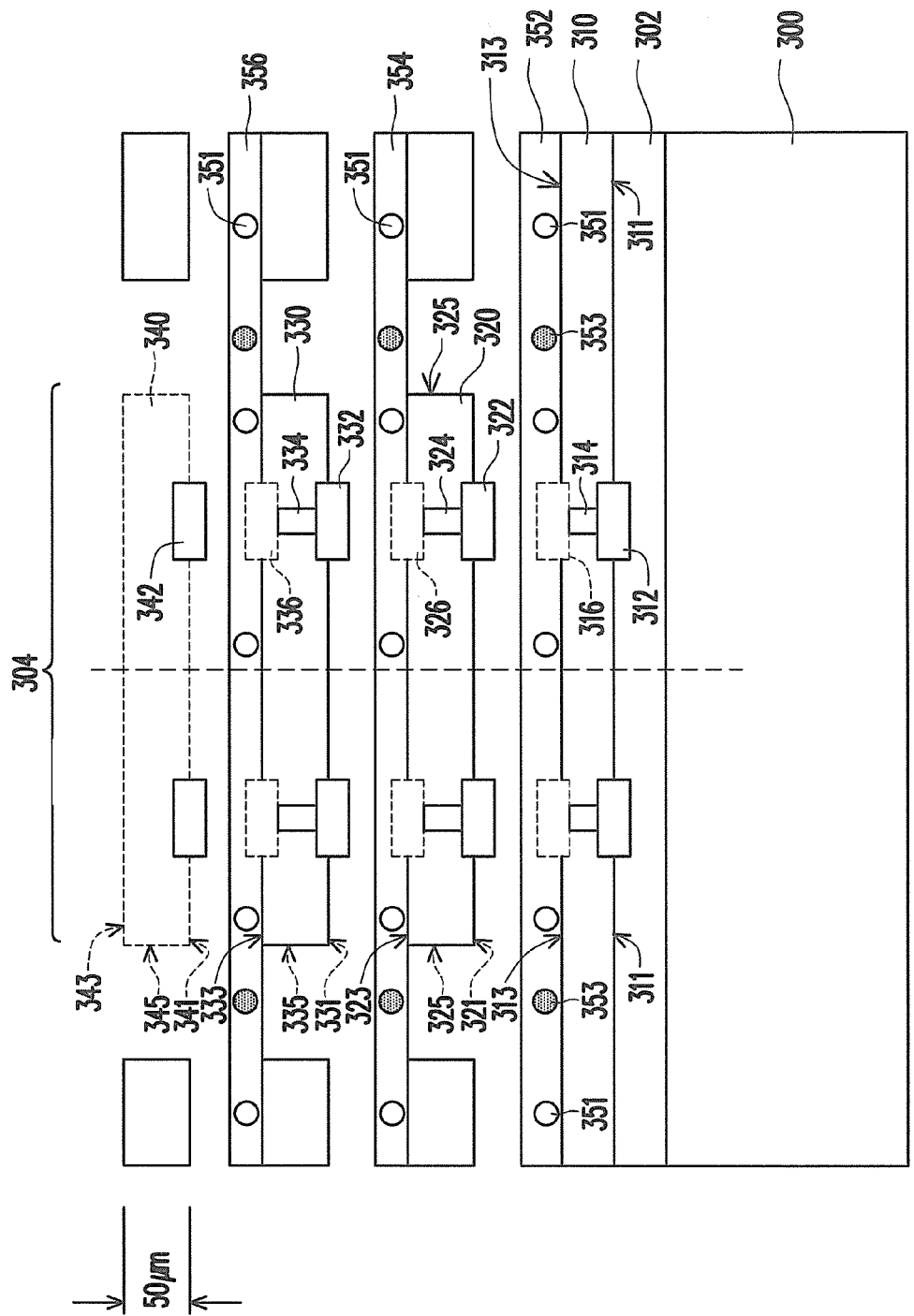
FIG. 3B is a schematic diagram illustrating a manufacturing process of the wafer level molding structure of FIG. 3A according to an embodiment of the disclosure.

FIG. 3B is a schematic diagram illustrating a manufacturing process of the wafer level molding structure of FIG. 3A according to an embodiment of the disclosure.

First, the wafer 310 is provided, and the wafer 310 comprises the wafer front side 311 and the wafer back side 313, and a plurality of front side bumps and a plurality of back side bumps are respectively disposed on the wafer front side 311 and the wafer back side 313, for example, the wafer back side bumps 312 and wafer front side bumps 316 as shown in FIG. 3B. The wafer 310 comprises a plurality of through electrodes as that shown in FIG. 3B, which are used for electrically connecting the wafer back side bumps 316 and the wafer front side bumps 312. An adhesive material 352 is coated on a surface of the wafer back side 313 of the wafer 310, and the adhesive material 352 comprises a plurality of conductive particles 351 and a plurality of non-conductive particles 353. It should be noticed that although the adhesive material 352 comprising the conductive particles 351 is taken as an example for description in the following embodiments, the aforementioned bonding method can also be used, which is not limited by the disclosure.

Then, a plurality of chips (for example, the first, second and third chips 320, 330 and 340 shown in FIG. 3B) used to form the COW stacking structure is provided. In the embodiment, a part of the chips is described, though regarding the whole wafer, the same layer may have a plurality of chips to form the stacking structure, which is not described in detail herein.

The first chip 320 comprises a first front side 321, a first back side 323 and a plurality of first lateral sides 325. For example, a plurality of first front side bumps 322 are formed on the first front side 321, and a plurality of first back side bumps 326 are selectively formed on the first back side 323 of first chip 320 as that shown in FIG. 3B. The through electrodes are electrically connected between a part of the front side bumps and the back side bumps of the first chip 320, for example, the first through electrodes 324 are electrically connected between the first front side bumps 322 and the first back side bumps 326 as that shown in FIG. 3B.

In the whole wafer level stacking structure, an adhesive material 354 is coated on a surface of the first back side 323 of the first chip 320, for example, a wafer level ACA lamination process is performed.

The second chip 330 comprises a second front side 331, a second back side 333 and a plurality of second lateral sides 335. For example, a plurality of second front side bumps 332 are formed on the second front side 331, and the second back side bumps 336 are selectively formed on the second back side 333 of second chip 330 as that shown in FIG. 3B. A plurality of second through electrodes may be electrically connected between a part of the second front side bumps and the second back side bumps of the second chip 330, for example, the second through electrodes 334 are electrically connected between the second front side bumps 332 and the second back side bumps 336 as that shown in FIG. 3B. In the whole wafer level stacking structure, an adhesive material 356 (for example, the ACA) is coated on the back side surface of the second chip 330.

The uppermost layer of the COW stacking structure is, for example, the third chip 340, which comprises a third front side 341, a third back side 343 and a plurality of third lateral sides 345. A plurality of bumps, for example, the third front side bumps 342 are disposed on the third front side 341.

The first, second and third chips 320, 330 and 340 and the wafer 310 are aligned for stacking, and the adhesive material for example, the ACA is used to bond the first, second and third chips 320, 330 and 340 and the wafer 310, so as to electrically connect the aforementioned front side bumps and the back side bumps, and cover the first, second and third lateral sides 325, 335 and 345 of the first, second and third chips 320, 330 and 340.

Figure 1:
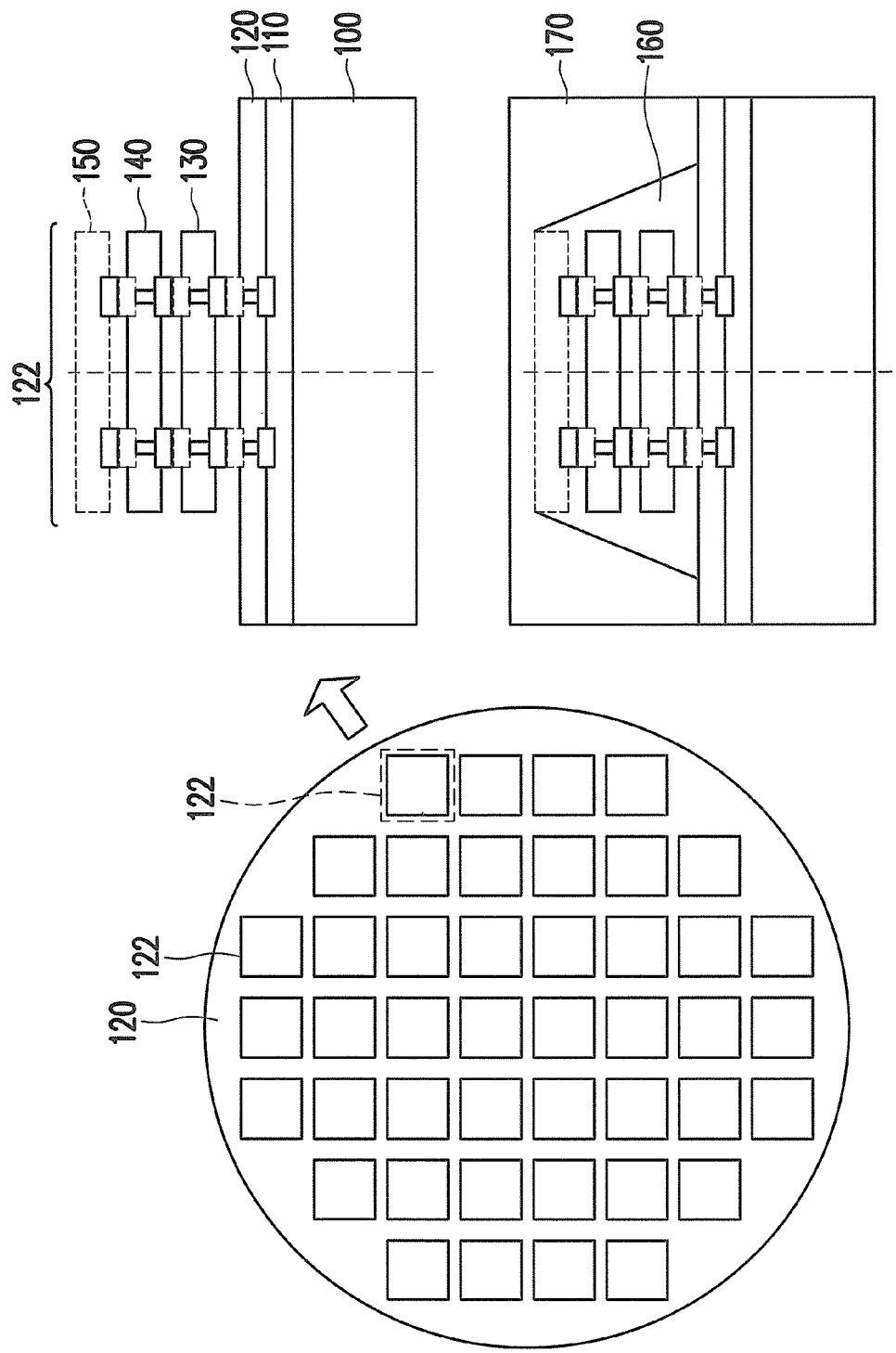
FIG. 1 is a structure schematic diagram of a conventional chip-to-wafer (COW) packaging technique using an underfilling process.
Figure 2:
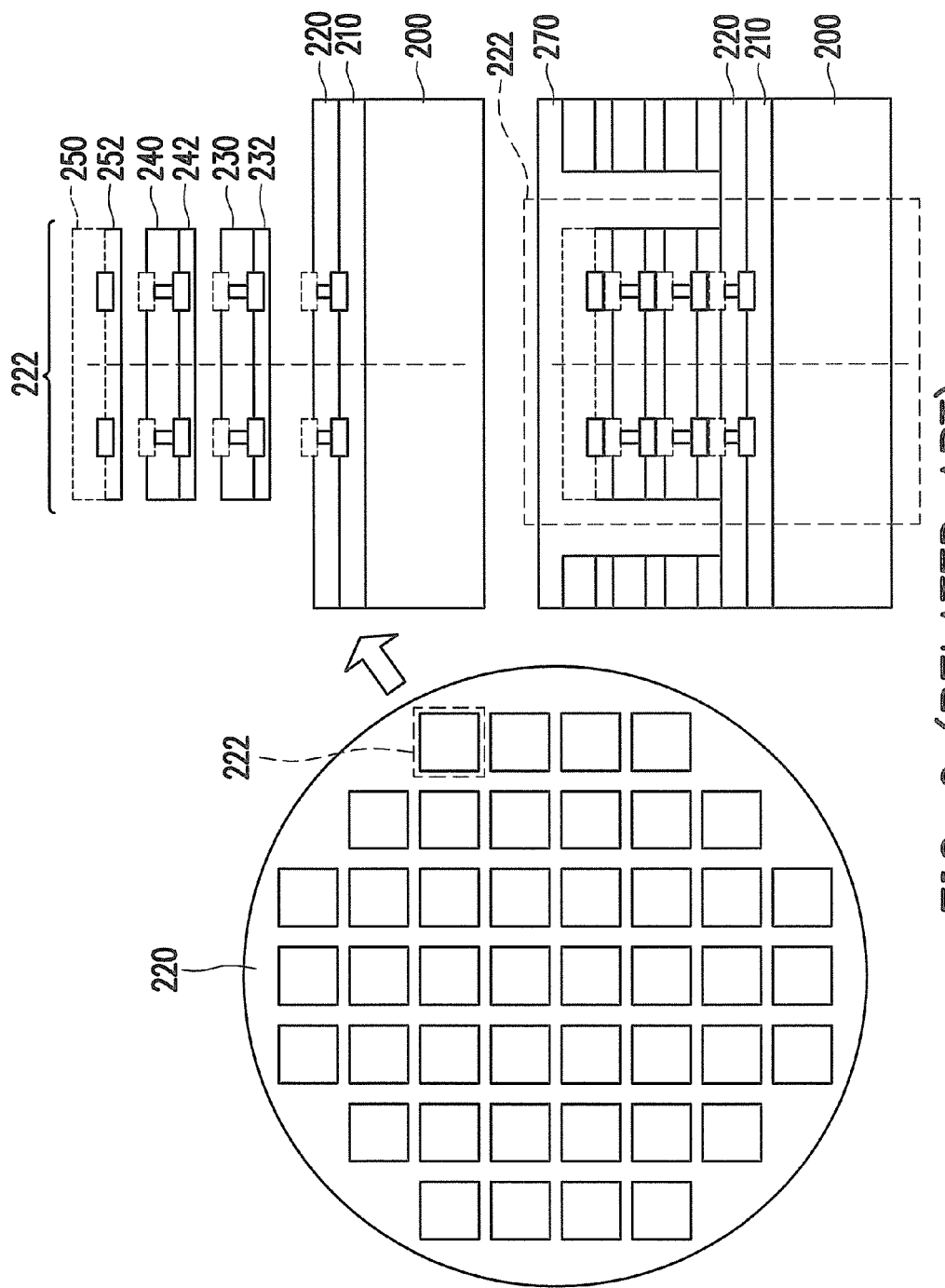
FIG. 2 is a structure schematic diagram of the conventional COW packaging technique using a non-flow underfill (NFU).

Regarding the manufacturing process of the wafer level molding structure of FIG. 3B, two steps of the wafer level ACA lamination step and the stacking step are required, which spend relatively less time compared to the three steps of stacking, underfilling and molding of FIG. 1, or the three steps of the NFU material adhesion, stacking and molding of FIG. 2 of the conventional technique, so as to effectively reduce a fabrication cost. Regarding the underfilling process and the molding process, as long as the same material is used, the fabrication cost is reduced. Moreover, since the chip structures are electrically connected through the ACA conductive particles, in case of the thermal expansion mismatch, the production yield is not influenced.

The wafer level molding structure of the disclosure may be applied in a plurality of embodiments, where the chip stacking structures of a part of the embodiments are as that shown in FIGS. 4A-4G.

Figure 4A:
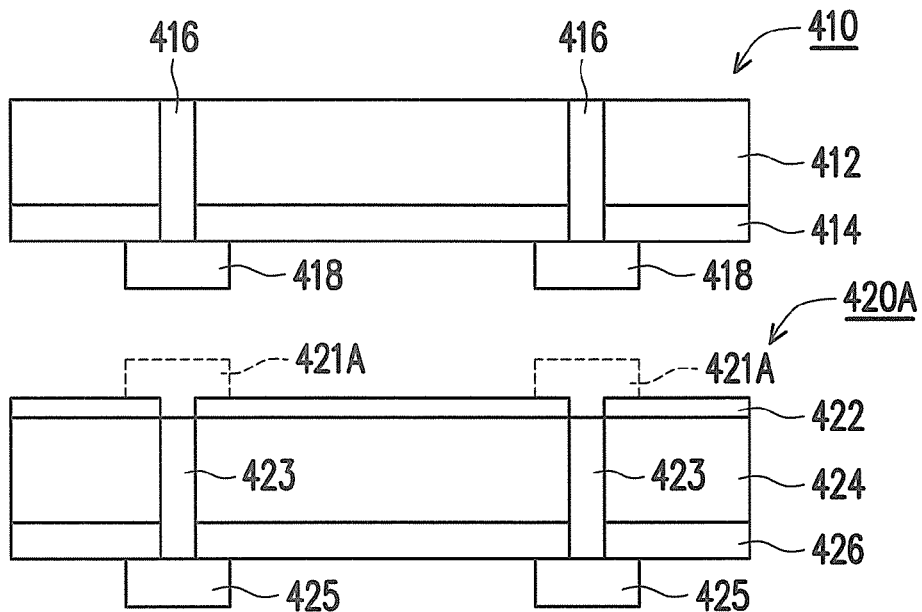
FIGS. 4A-4G are schematic diagrams illustrating wafer level molding structures according to different embodiments of the disclosure.

As shown in FIG. 4A, the wafer level molding structure of the disclosure comprises at least an upper chip 410 and a lower chip 420A stacked and electrically connected to each other. A thickness of each of the upper chip 410 and the lower chip 420A is, for example, smaller than 100 μm and greater than 5 μm.

The upper chip 410 comprises a substrate layer 412 and a patterned conductive layer 414. The patterned conductive layer 414 is a layout of various devices formed on the substrate layer 412 during a back-end-of-line (BEOL) process, and a plurality of electrodes 418 is formed on the front side of the upper chip 410. Through electrodes 416 are formed in the upper chip 410 and are respectively connected to the electrodes 418.

The lower chip 420A comprises a front side and a back side, and a plurality of front side bumps 425 is formed on the front side. In the embodiment, an insulating layer 422 (for example, a dielectric layer) is formed on the back side of the lower chip 420. A plurality of electroplating metal bumps 421A is formed on the insulating layer 422. A plurality of through electrodes 423 is used to electrically connect the front side bumps 425 and the electroplating metal bumps 421A.

Figure 4B:
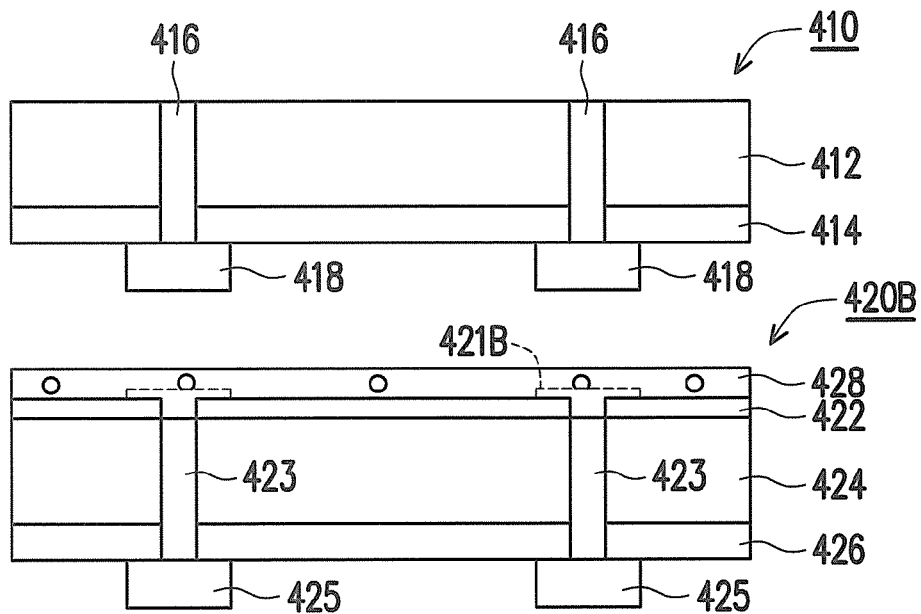

FIG. 4B is a schematic diagram of a wafer level molding structure according to another embodiment of the disclosure. The wafer level molding structure of FIG. 4B is similar to that of FIG. 4A, and a difference there between is that a plurality of electroless metal bumps 421B is formed on the insulating layer 422 on the back side of the lower chip 420B. Then, a wafer level ACA 428 is formed on the insulating layer 422. Based on ACA joint, the electrodes 418 of the upper chip 410 may be stacked and electrically connected to the electroless metal bumps 421B of the lower chip 420B.

Figure 4C:
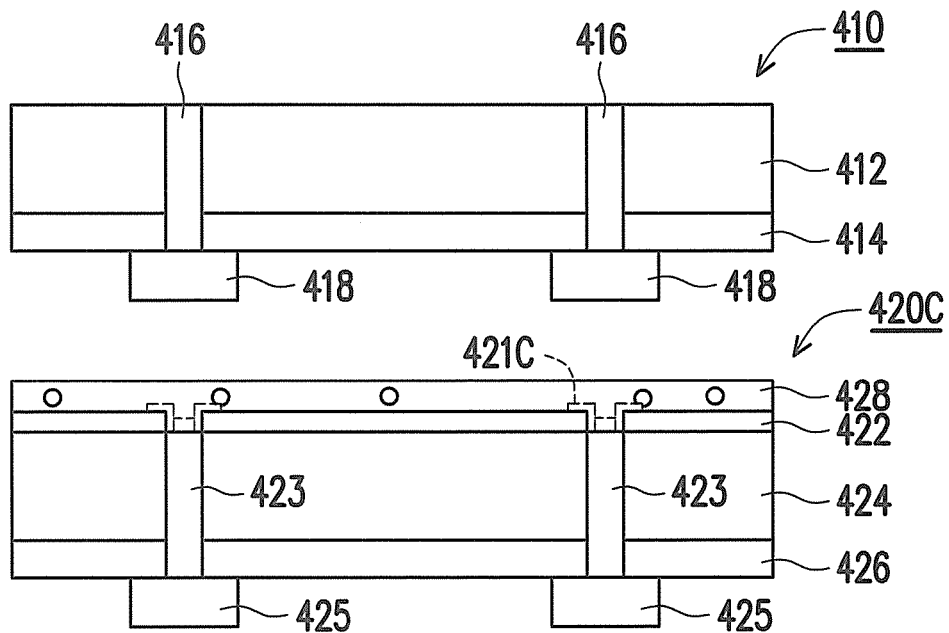

FIG. 4C is a schematic diagram of a wafer level molding structure according to another embodiment of the disclosure. The wafer level molding structure of FIG. 4C is similar to that of FIG. 4A, and a difference there between is that a plurality of back side metal thin films 421C is formed on the insulating layer 422 on the back side of the lower chip 420C. Then, the wafer level ACA 428 is formed on the insulating layer 422. Based on ACA joint, the electrodes 418 of the upper chip 410 may be stacked and electrically connected to the back side metal thin films 421C of the lower chip 420C.

Figure 4D:
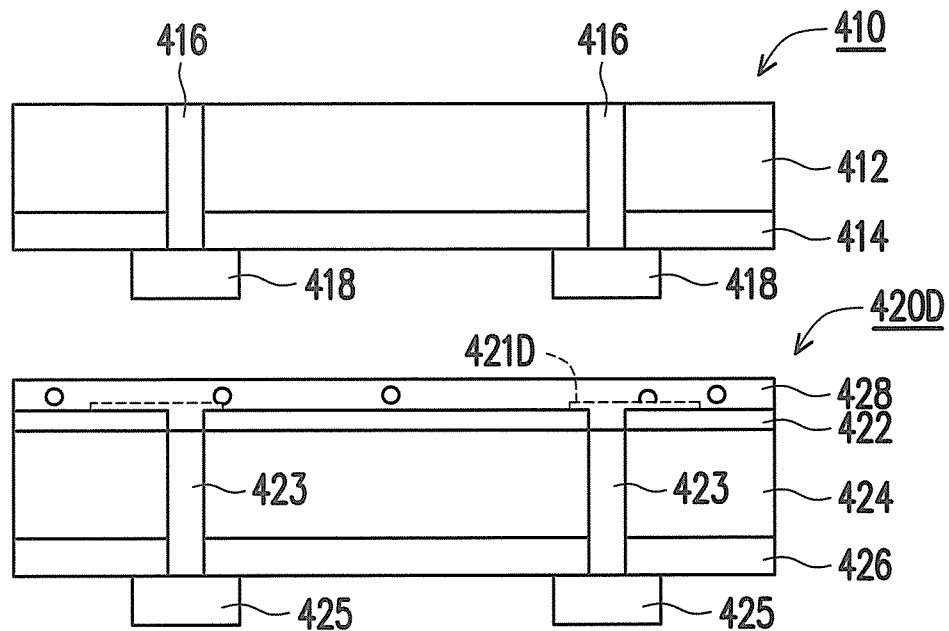

FIG. 4D is a schematic diagram of a wafer level molding structure according to another embodiment of the disclosure. The wafer level molding structure of FIG. 4D is similar to that of FIG. 4A, and a difference there between is that a redistribution layer (RDL) 421D is formed on the insulating layer 422 on the back side of the lower chip 420D. A material of the redistribution layer 421D is, for example, aluminium, copper or an alloy thereof. Then, the wafer level ACA 428 is formed on the insulating layer 422. Based on ACA joint, the electrodes 418 of the upper chip 410 may be stacked and electrically connected to the redistribution layer 421D of the lower chip 420D. Such structure can mitigate an alignment problem.

Figure 4E:
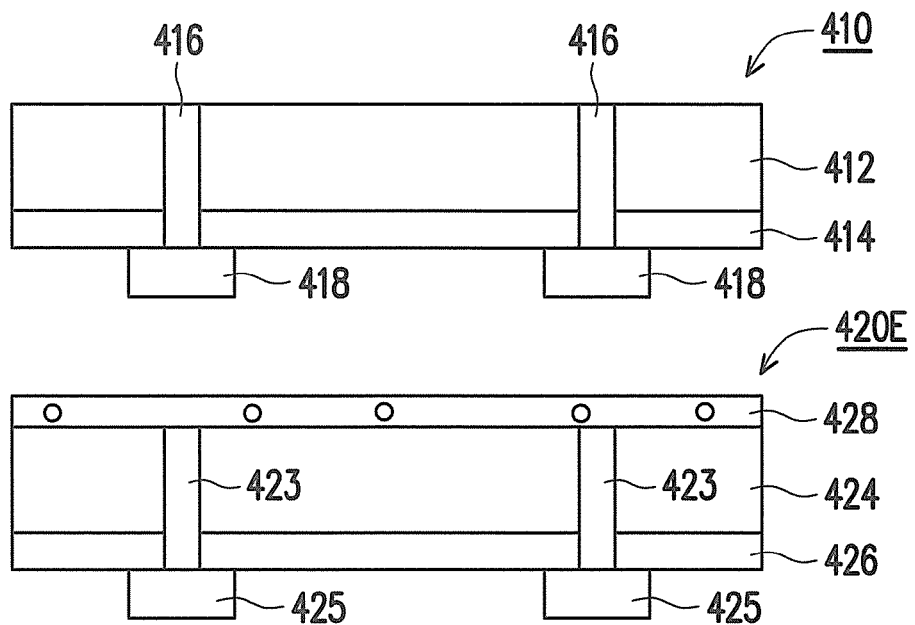

FIG. 4E is a schematic diagram of a wafer level molding structure according to another embodiment of the disclosure. The wafer level molding structure of FIG. 4E is similar to that of FIG. 4A. The embodiment is adapted to a through-silicon-via (TSV) structure, and a difference between the wafer level molding structure of FIG. 4E and that of FIG. 4A is that TSVs 423 and the ACA 428 on the back side of the lower chip 420E are directly used to electrically connect the electrodes 418 of the upper chip 410.

Figure 4F:
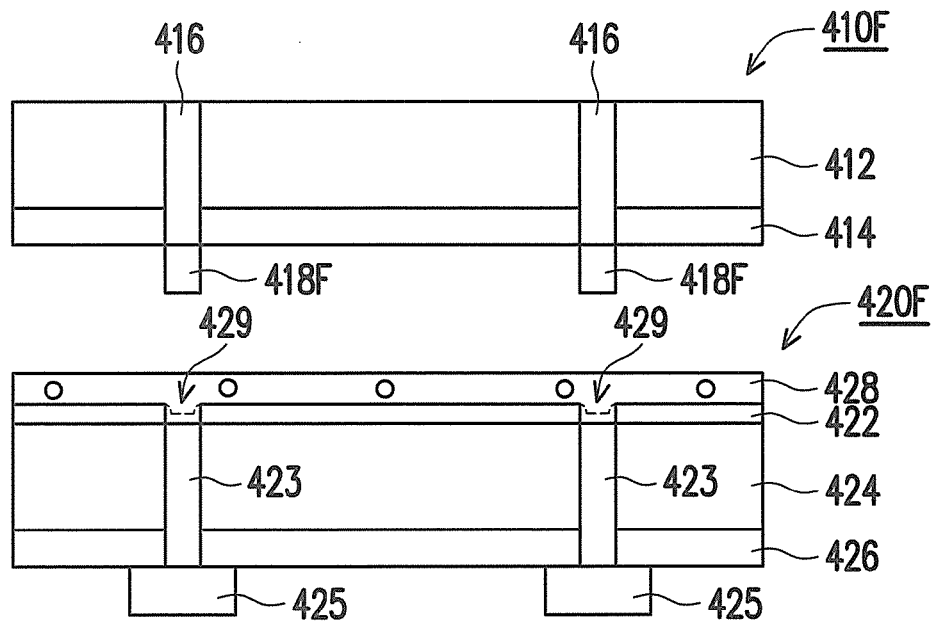

FIG. 4F is a schematic diagram of a wafer level molding structure according to another embodiment of the disclosure.

The wafer level molding structure of FIG. 4F is similar to that of FIG. 4A, and a difference there between lies in pillar electrodes 418F on the front side of the upper chip 410, and a plurality of back side metal thin film cavities 429 is formed on the insulating layer 422 on the back side of the lower chip 420F. Then, the wafer level ACA 428 is formed on the insulating layer 422. Based on ACA joint, the pillar electrodes 418F of the upper chip 410 can be stacked and electrically connected to the through electrodes 423 or the TSVs of the lower chip 420F through the ACA 428 in the back side metal thin film cavities 429 of the lower chip 420F.

Figure 4G:
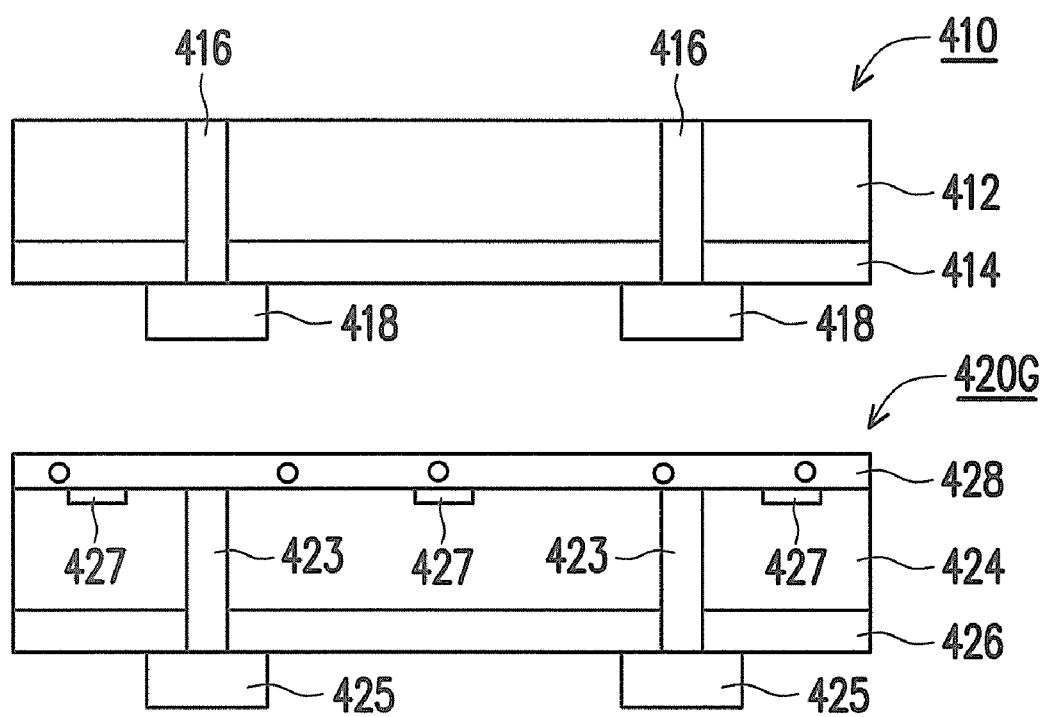

FIG. 4G is a schematic diagram of a wafer level molding structure according to another embodiment of the disclosure. The wafer level molding structure of FIG. 4G is similar to that of FIG. 4E, and the similar parts are not repeated. The embodiment is adapted to the through-silicon-via (TSV) structure, and a difference between the wafer level molding structure of FIG. 4G and that of FIG. 4A is that the TSVs 423 and the ACA 428 on the back side of the lower chip 420G are directly used to electrically connect the electrodes 418 of the upper chip 410. A difference between the wafer level molding structure of FIG. 4G and that of FIG. 4E is that a plurality of grooves 427 is formed on the back side of the lower chip 420G to prevent sliding of the bonding structure.

Figure 5:
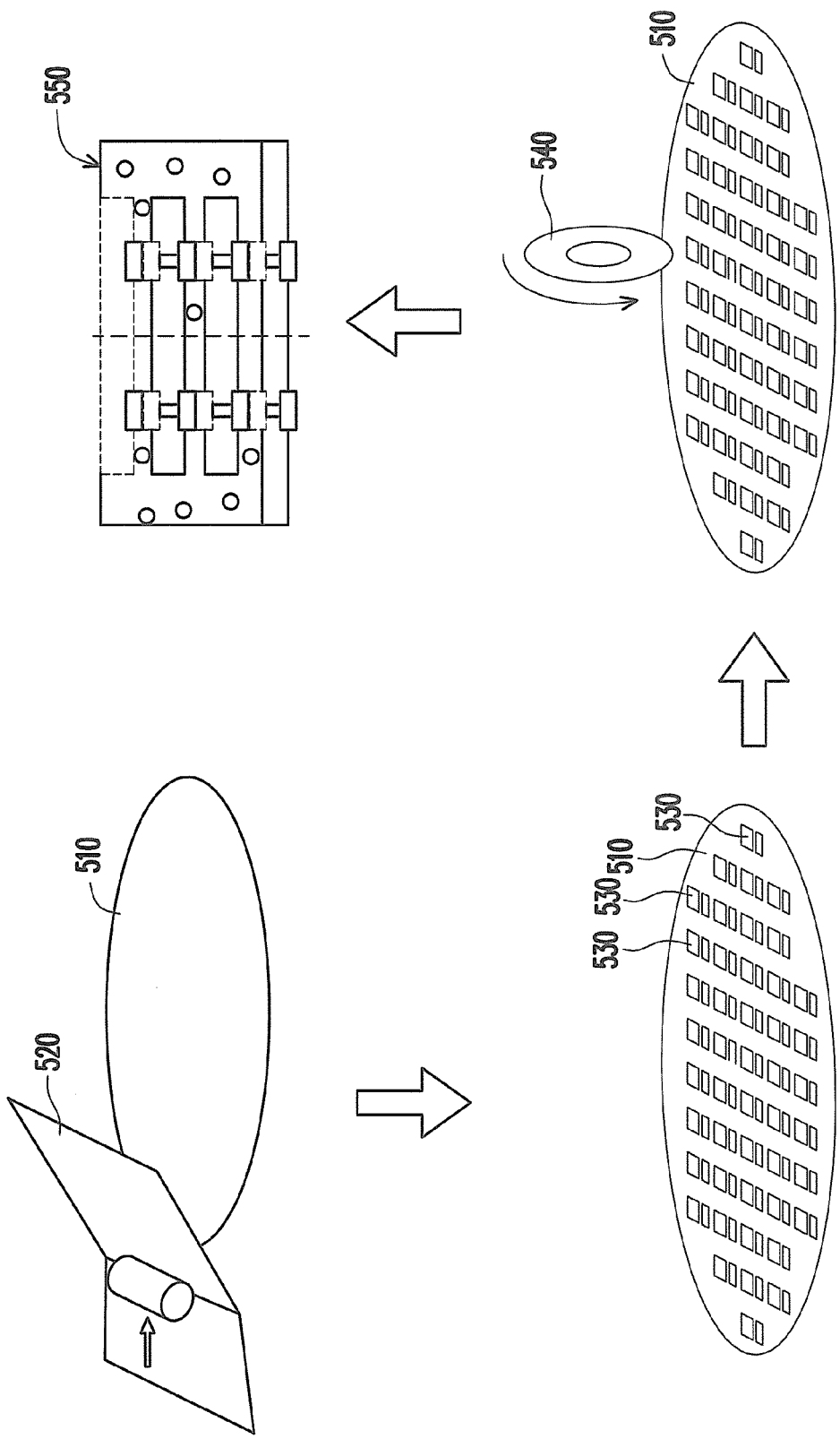
FIG. 5 is a schematic diagram illustrating a manufacturing process of a wafer level molding structure according to an embodiment of the disclosure.

FIG. 5 is a schematic diagram illustrating a manufacturing process of a wafer level molding structure according to an embodiment of the disclosure.

First, a wafer 510 is provided, where the wafer 510 comprises a front side and a back side, and an adhesive material 520 (for example, an ACA) is formed on the back side surface of the wafer 510. The adhesive material 520 comprises a plurality of conductive particles and polymer adhesive, and the adhesive material 520 can be formed through adhering or coating.

Then, the COW stacking process is performed, by which based on a pre-bond process, a plurality of bumps is formed on the front side and/or the back side of the chips. Then, an adhesive material is formed on the chips, for example, a wafer level ACA lamination is performed to form a plurality of chip stacking structures 530. Then, a bonding process is performed on the whole wafer, and then a dicing wheel 540 is used to perform a dicing process to form a plurality of the molding structures 550.

In one of the wafer level molding structures of the disclosure, a high density electrode bonding may be achieved to reduce a bonding interface temperature to be lower than or equal to 200° C. 200° C.), though it is greater than 80° C., but also a process time can be reduced to be smaller than or equal to 2 seconds, though it is greater than 0.5 second, and the wafer level molding structure is synchronously completed.

The disclosure provides a method for manufacturing a wafer level molding structure, which can effectively reduce the manufacturing steps and the manufacturing cost (dispensing and molding are completed in one step), and the conductive particles or the non-conductive particles are filled in the molding material to reduce a thermal resistance thereof, so as to increase reliability of the wafer level molding structure.

The disclosure provides a wafer level molding structure, in an embodiment, the wafer level molding structure can be extended, so that the structures stacked with different chips are also considered to be within the scope of the disclosure.

Figure 6A:
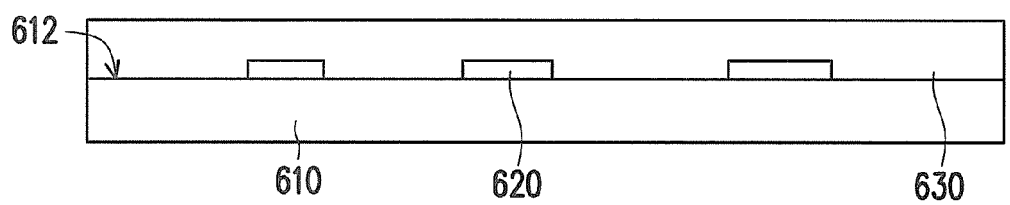
FIGS. 6a-6e are diagrams illustrating a method for manufacturing a wafer level molding structure according to an embodiment of the disclosure.

FIGS. 6a-6e are diagrams illustrating a method for manufacturing a wafer level molding structure according to an embodiment of the disclosure. Referring to FIG. 6a, a substrate 610 is provided, where the substrate 610 has an active surface 612, and a first patterned conductive layer 620 is located on the active surface 612. The active surface 612 of the substrate 610 is covered by a first adhesive layer 630.

Figure 6B:
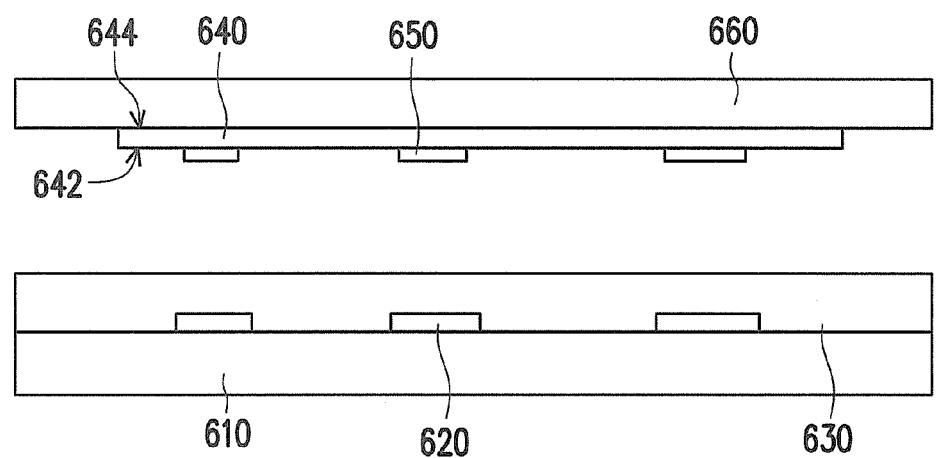

Referring to FIG. 6b, a first chip 640 comprising a first surface 642 and a second surface 644 is provided, where a second patterned conductive layer 650 is located on the first surface 642. Then, a cushion material layer 660 is provided, and the cushion material layer 660 is attached to the first chip 640, where the second surface 644 of the first chip 640 is connected to the cushion material layer 660. An area of the cushion material layer 660 is greater than an area of the second surface 644 of the first chip 640, and a material the cushion material layer 660 is, for example, silicon rubber. A thickness of the first chip 640 is smaller than 100 μm, and in an embodiment, the first chip 640 is a thin chip of a 50 μm level.

Figure 6C:
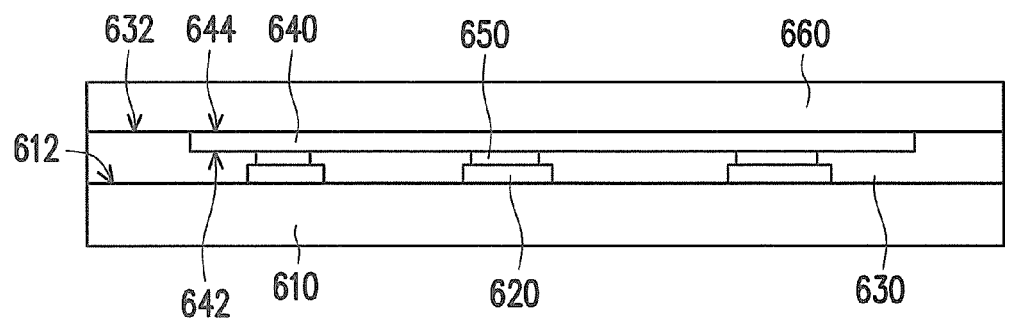

Referring to FIG. 6c, the first chip 640 attached with the cushion material layer 660 is connected to the substrate 610, so that the second patterned conductive layer 650 of the first chip 640 and the first patterned conductive layer 620 of the substrate 610 are electrically connected. A first lamination process is performed to the substrate 610 and the first chip 640 attached with the cushion material layer 660, where a time length of the first lamination process can be smaller than or equal to 10 seconds, which is greater than 0.5 second, and a bonding interface temperature can be lower than or equal to 200° C., though it is greater than 80° C.

Figure 6D:
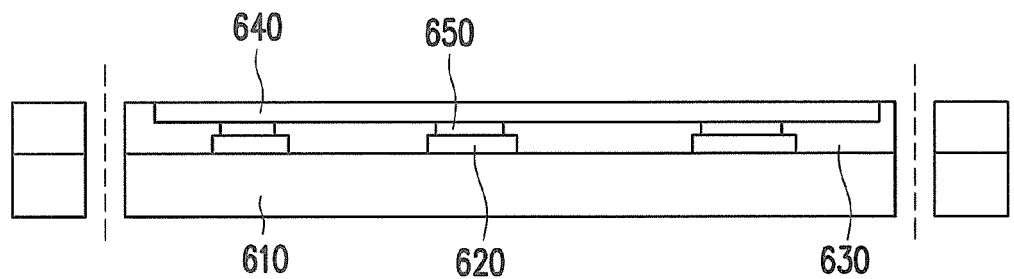
Figure 6E:
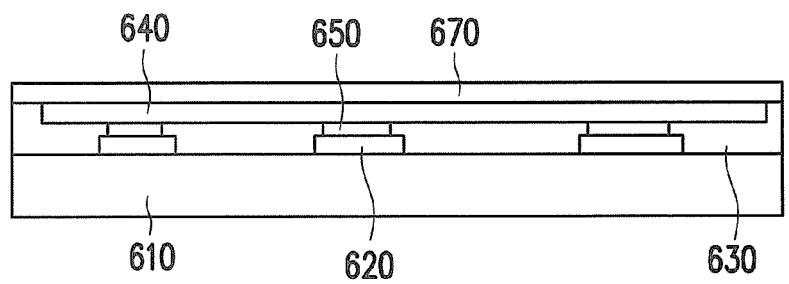

In a selective embodiment, the first patterned conductive layer 620 of the substrate 610 and the second patterned conductive layer 650 of the first chip 640 can be electrically connected through, for example, metal joint. In another selective embodiment, the first adhesive layer 630 further comprises a plurality of conductive particles, and the second patterned conductive layer 650 of the first chip 640 is electrically connected to the first patterned conductive layer 620 of the substrate 610 through the conductive particles. After the lamination process, as shown in FIG. 6d, regarding a surface 632 of the first adhesive layer 630 relative to the active surface 612 of the substrate 610, a vertical height between the surface 632 and the active surface 612 of the substrate 610 is substantially equal to a vertical height between the second surface 644 of the first chip 640 and the active surface 612 of the substrate 610. After the cushion material layer 660 is removed, the second surface 644 of the first chip 640 and the surface 632 of the first adhesion layer 630 are substantially exposed in a same height level, and a protection layer 670 is formed thereon.

Figure 7A:
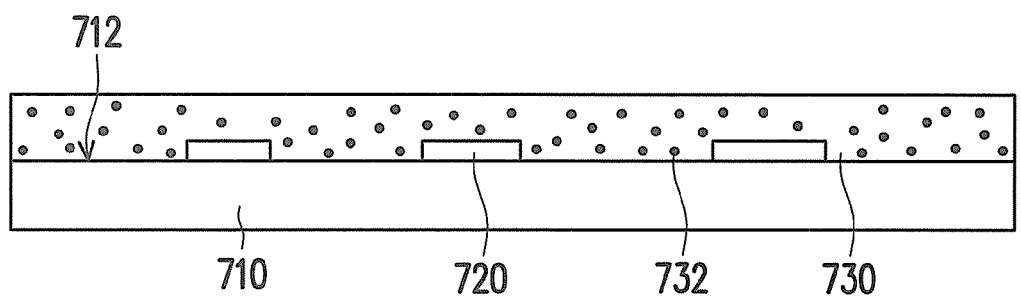
FIGS. 7a-7e are diagrams illustrating a method for manufacturing a wafer level molding structure according to another embodiment of the disclosure.

FIGS. 7a-7e are diagrams illustrating a method for manufacturing a wafer level molding structure according to another embodiment of the disclosure. Referring to FIG. 7a, a substrate 710 is provided, where the substrate 710 has an active surface 712, and a first patterned conductive layer 720 is located on the active surface 712. The active surface 712 of the substrate 710 is covered by a first adhesive layer 730, where the adhesive layer 730 further comprises a plurality of conductive particles 732.

Figure 7B:
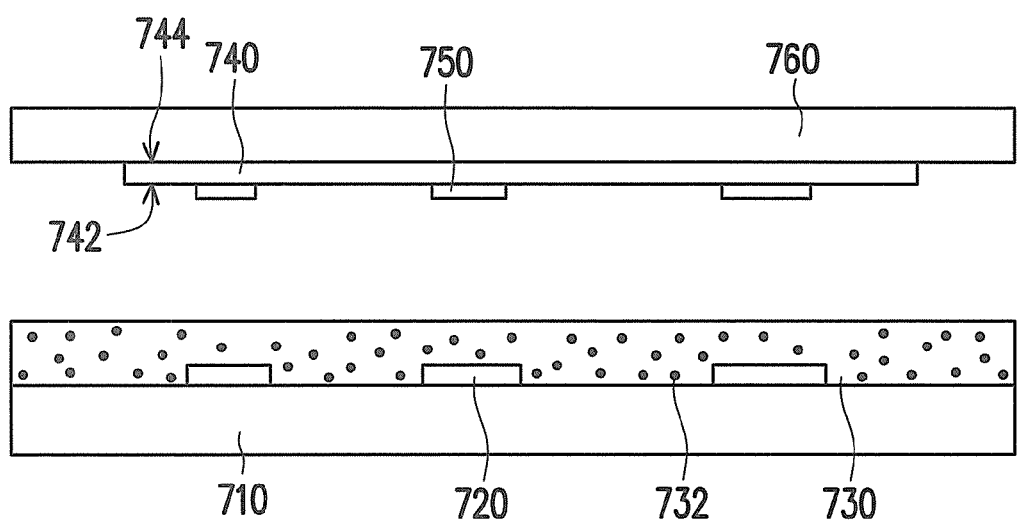

Then, referring to FIG. 7b, a first chip 740 comprising a first surface 742 and a second surface 744 is provided, where a second patterned conductive layer 750 is located on the first surface 742. Then, a cushion material layer 760 is provided, and the cushion material layer 760 is attached to the first chip 740, where the second surface 744 of the first chip 740 is connected to the cushion material layer 760. An area of the cushion material layer 760 is greater than an area of the second surface 744 of the first chip 740, and a material the cushion material layer 760 is, for example, silicon rubber. A thickness of the first chip 740 is smaller than 100 μm, and in an embodiment, the first chip 740 is a thin chip of a 50 μm level.

Figure 7C:
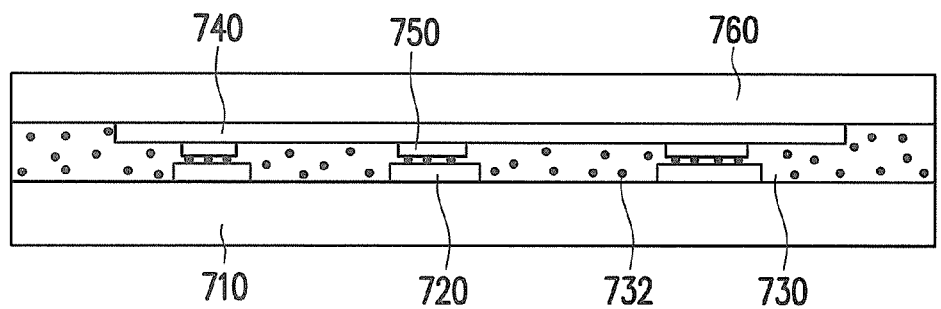

Referring to FIG. 7c, the first chip 740 attached with the cushion material layer 760 is connected to the substrate 710, so that the second patterned conductive layer 750 of the first chip 740 and the first patterned conductive layer 720 of the substrate 710 are electrically connected. A first lamination process is performed to the substrate 710 and the first chip 740 attached with the cushion material layer 760, where a time length of the first lamination process can be smaller than or equal to 10 seconds, which is greater than 0.5 second, and a bonding interface temperature can be lower than or equal to 200° C., though it is greater than 80° C.

Figure 7D:
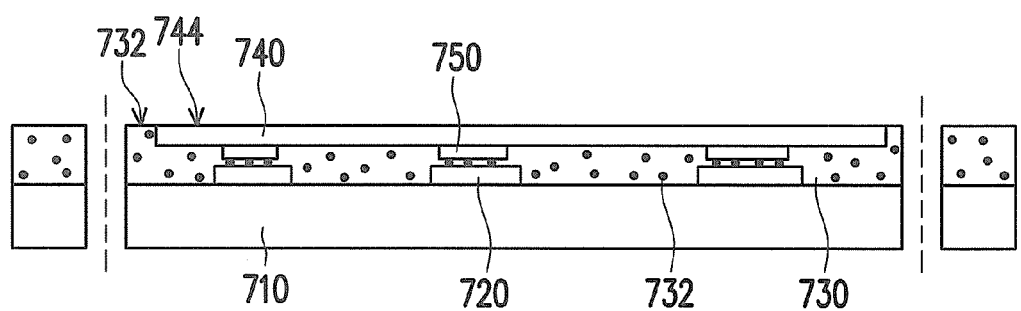
Figure 7E:
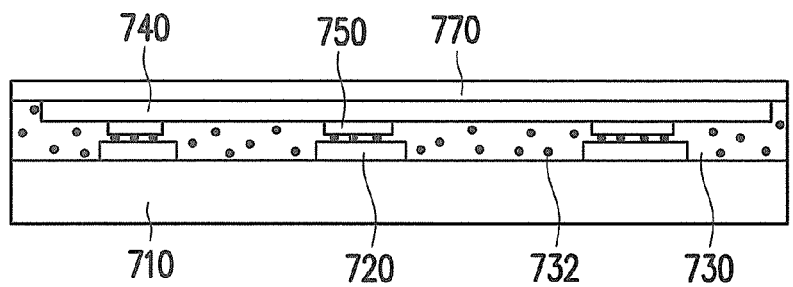

Regarding the bonding of the first patterned conductive layer 720 of the substrate 710 and the second patterned conductive layer 750 of the first chip 740, in the embodiment, the second patterned conductive layer 750 of the first chip 740 is electrically connected to the first patterned conductive layer 720 of the substrate 710 through the conductive particles 732. After the lamination process, as shown in FIG. 7d, a vertical height between the surface 732 and the active surface 712 of the substrate 710 is substantially equal to a vertical height between the second surface 744 of the first chip 740 and the active surface 712 of the substrate 710. As shown in FIG. 7e, after the cushion material layer 760 is removed, the second surface 744 of the first chip 740 and the surface 732 of the first adhesion layer 730 are substantially exposed in a same height level, and a protection layer 770 is formed thereon.

Figure 8A:
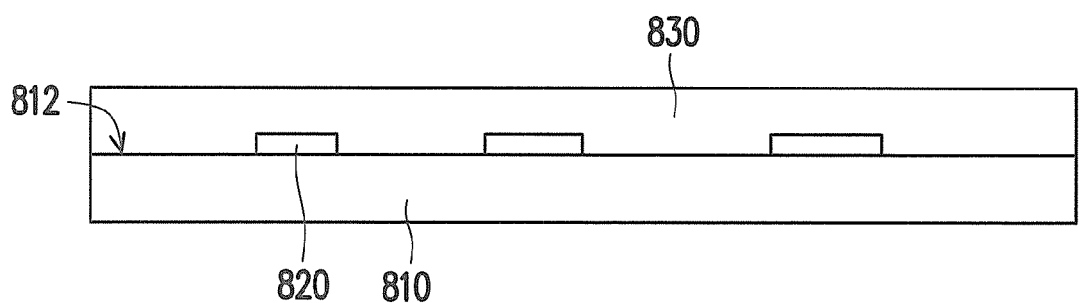
FIGS. 8a-8f are diagrams illustrating a method for manufacturing a wafer level molding structure according to another embodiment of the disclosure.

FIGS. 8a-8f are diagrams illustrating a method for manufacturing a wafer level molding structure according to another embodiment of the disclosure. Referring to FIG. 8a, a substrate 810 is provided, where the substrate 810 has an active surface 812, and a first patterned conductive layer 820 is located on the active surface 812. The active surface 812 of the substrate 810 is covered by a first adhesive layer 831. A material of the first adhesive layer 831 is, for example, ACA or polymer adhesive, which comprises a plurality of conductive particles and/or non-conductive particles. The conductive particles or the non-conductive particles are filled in the molding material to reduce a thermal resistance thereof, so as to increase reliability of the wafer level molding structure.

Figure 8B:
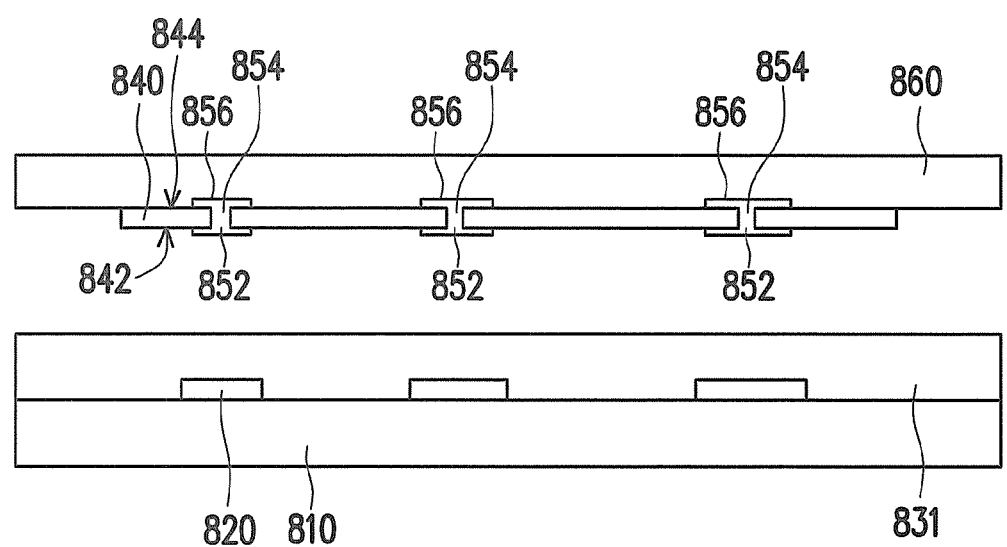

Then, referring to FIG. 8b, a first chip 840 comprising a first surface 842 and a second surface 844 is provided, where the first chip 840 has a plurality bumps 852 on the first surface 842, and has a plurality of bumps 856 on the second surface 844, and an interconnection structure 854 is formed between each of the bumps 852 and the corresponding bump 856. The interconnection structure 854 is a through-silicon-via (TSV) structure, and the bumps 852 and 856 can be metal or conductive materials.

Then, a cushion material layer 860 is provided, and the cushion material layer 860 is attached to the first chip 840, where the second surface 844 of the first chip 840 is connected to the cushion material layer 860. An area of the cushion material layer 860 is greater than an area of the second surface 844 of the first chip 840, and a material the cushion material layer 860 is, for example, silicon rubber. A thickness of the first chip 840 is smaller than 100 μm, and in an embodiment, the first chip 840 is a thin chip of a 50 μm level.

Figure 8C:
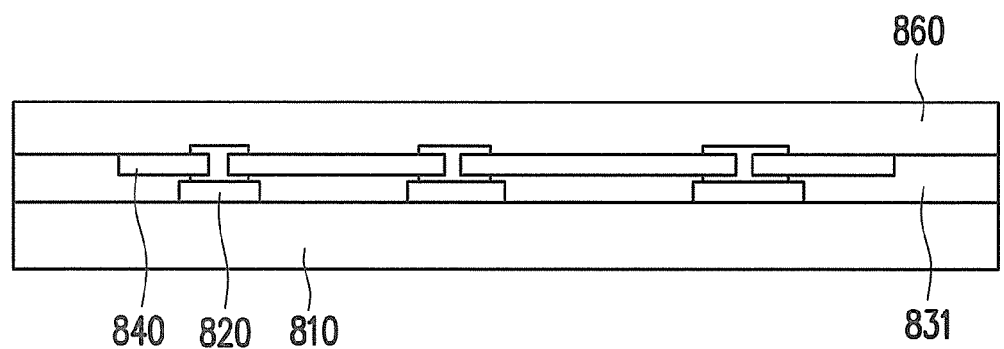

Referring to FIG. 8c, the first chip 840 attached with the cushion material layer 860 is connected to the substrate 810, so that the bumps 852 of the first chip 840 and the first patterned conductive layer 820 of the substrate 810 are electrically connected. A first lamination process is performed to the substrate 810 and the first chip 840 attached with the cushion material layer 860, where a time length of the first lamination process can be smaller than or equal to 10 seconds, which is greater than 0.5 second, and a bonding interface temperature can be lower than or equal to 200° C., though it is greater than 80° C.

In a selective embodiment, the first patterned conductive layer 820 of the substrate 810 and the bumps 852 of the first chip 840 can be electrically connected through, for example, metal joint. In another selective embodiment, the first adhesive layer 831 further comprises a plurality of conductive particles, and the bumps 852 of the first chip 840 are electrically connected to the first patterned conductive layer 820 of the substrate 810 through the conductive particles. After the lamination process, as shown in FIG. 8d, a vertical height between the surface 832 and the active surface 812 of the substrate 810 is substantially equal to a vertical height between the second surface 844 of the first chip 840 and the active surface 812 of the substrate 810.

Figure 8D:
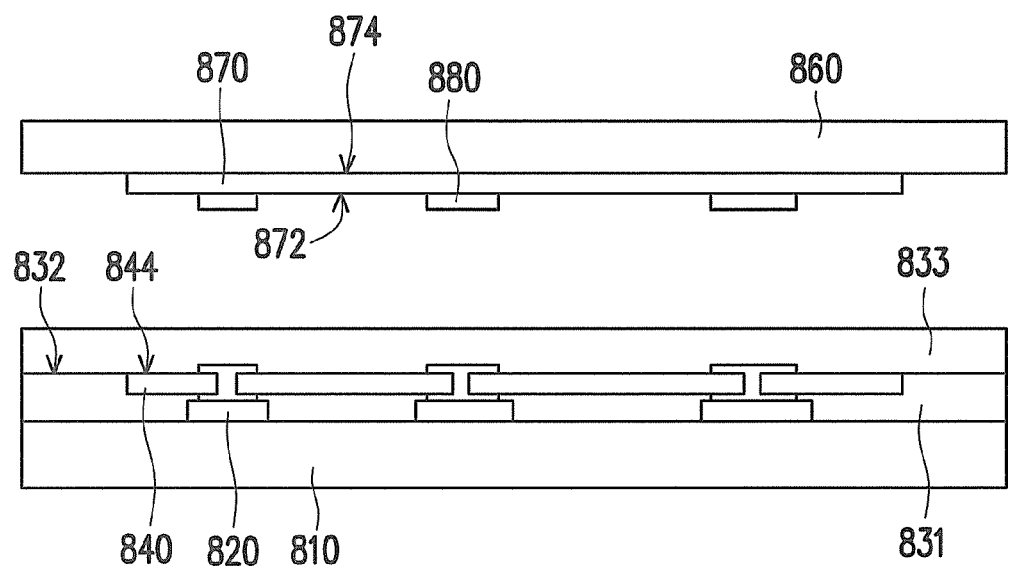

As shown in FIG. 8d, after the cushion material layer 860 is removed, the second surface 844 of the first chip 840 and the surface 832 of the first adhesive layer 831 are covered by a second adhesive layer 833. Then, a second chip 870 comprising a third surface 872 and a fourth surface 874 is provided, where the third surface 872 comprises a second patterned conductive layer 880. Then, the cushion material layer 860 is attached to the second chip 870, and is bonded to the fourth surface 874 of the second chip 870.

Figure 8E:
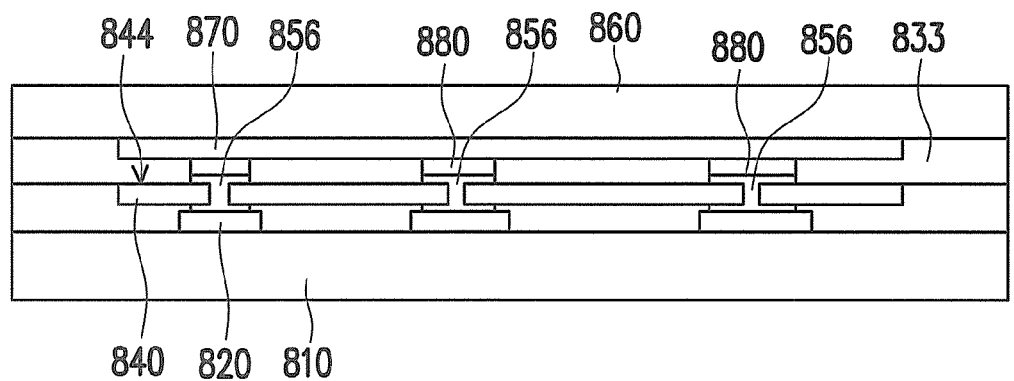

Then, referring to FIG. 8e, the second chip 870 attached with the cushion material layer 860 is connected to the second surface 844 of the first chip 840, so that the second patterned conductive layer 880 of the second chip 870 and the bumps 856 on the second surface 844 of the first chip 840 are electrically connected. A second lamination process is performed to the first chip 840 and the second chip 870 attached with the cushion material layer 860, where a time length of the second lamination process is smaller than 10 seconds, and a bonding interface temperature is lower than 200° C.

In a selective embodiment, the bumps 856 of the first chip 840 and the second patterned conductive layer 880 of the second chip 870 can be electrically connected through, for example, metal joint. In another selective embodiment, the second adhesive layer 833 further comprises a plurality of conductive particles, and the second patterned conductive layer 880 of the second chip 870 is electrically connected to the bumps 856 of the first chip 840 through the conductive particles.

Figure 8F:
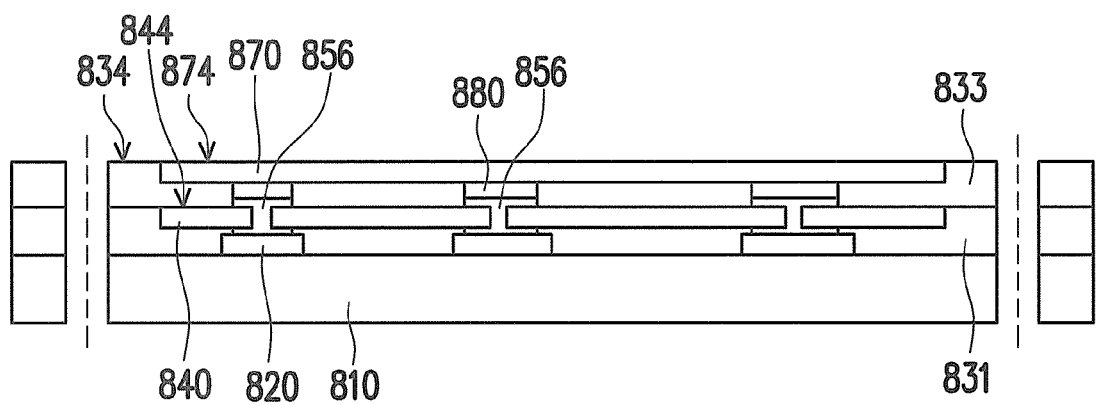

After the lamination process, as shown in FIG. 8f, a vertical height between a surface 834 of the second adhesive layer 833 and the second surface 844 of the first chip 840 is substantially equal to a vertical height between the second surface 874 of the second chip 870 and the second surface 844 of the first chip 840. After the cushion material layer 860 is removed, a protection layer can be formed on the second surface 874 of the second chip 870, or a third chip is stacked according to the above method. Now, the second chip 870 can also be a chip having the TSV structure.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A molding structure, comprising:
   a first chip, comprising:
      a first back side;

a first front side;
a plurality of first lateral sides; and
a plurality of first front side bumps, disposed on the first front side;
a second chip, comprising:
a second back side;
a second front side;
a plurality of second back side bumps, disposed on the second back side; and
a plurality of second front side bumps, disposed on the second front side;
a plurality of second through electrodes, disposed in the second chip, electrically connecting the second back side bumps and the second front side bumps of the second chip; and
an adhesive material, comprising a plurality of conductive particles, disposed between the first chip and the second chip, and covering the first lateral sides of the first chip,
wherein the first front side bumps of the first chip are electrically connected to the second back side bumps of the second chip.

2. The molding structure as claimed in claim 1, wherein the first chip further comprising:
a plurality of first through electrodes, disposed in the first chip; and
a plurality of first back side bumps, located on the first back side;
wherein the first through electrodes are electrically connect to the first front side bumps and the first back side bumps of the first chip, respectively.

3. The molding structure as claimed in claim 1, wherein the front side bumps and the back side bumps are electroplating metal bumps or electroless metal bumps.

4. The molding structure as claimed in claim 1, further comprising a dielectric layer is formed between the first front side of the first chip and the second back side of the second chip.

5. The molding structure as claimed in claim 1, wherein the adhesive material has a same thickness at the first lateral sides.

6. The molding structure as claimed in claim 1, wherein a thickness of the first chip is smaller than or equal to 100 μm and greater than 5 μm.

7. The molding structure as claimed in claim 1, wherein the first front side bumps of the first chip are electrically connected to the second back side bumps of the second chip through the conductive particles.

8. The molding structure as claimed in claim 7, wherein the adhesive material further comprises polymer adhesive, and the polymer adhesive contains a plurality of non-conductive particles.

9. A wafer level molding structure, comprising:
a wafer, comprising
a wafer back side, comprising a plurality of wafer back side bumps,
a wafer front side, comprising a plurality of wafer front side bumps, and
a plurality of wafer through electrodes, electrically connecting the wafer back side bumps and the wafer front side bumps; and
a plurality of stacking structures, wherein each of the stacking structures comprising
a first chip, comprising a first back side, a first front side, a plurality of first front side bumps disposed on the first front side and a plurality of first lateral sides; and
an adhesive material, comprising a plurality of conductive particles, disposed between the first chip and the wafer, and covering the first lateral sides of the first chip.

10. The wafer level molding structure as claimed in claim 9, wherein the first chip further comprises a plurality of first through electrodes located in the first chip and electrically connecting the first front side bumps.

11. The wafer level molding structure as claimed in claim 10, wherein the first back side of the first chip further comprises a plurality of first back side bumps for electrically connecting the first through electrodes.

12. The wafer level molding structure as claimed in claim 11, wherein each of the stacking structures further comprising:
a second chip, comprising
a second back side,
a second front side, a plurality of second lateral sides, and
a plurality of second front side bumps disposed on the second front side,
wherein the second front side bumps are electrically connected to the first back side bumps of the first chip, and the adhesive material covers the second lateral sides of the second chip.

13. The wafer level molding structure as claimed in claim 9, wherein the front side bumps are electroplating metal bumps or electroless metal bumps.

14. The wafer level molding structure as claimed in claim 9, further comprising a dielectric layer is formed between the first back side bumps and the first back side of the first chip.

15. The wafer level molding structure as claimed in claim 9, wherein the adhesive material has a same thickness at the first lateral sides.

16. The wafer level molding structure as claimed in claim 9, wherein the wafer back side bumps of the wafer are electrically connected to the first front side bumps of the first chip through the conductive particles.

17. The wafer level molding structure as claimed in claim 16, wherein the adhesive material further comprises polymer adhesive, and the polymer adhesive contains a plurality of non-conductive particles.

18. A packaging structure of a wafer level chip, comprising:
a substrate, comprising an active surface, wherein a first patterned conductive layer is located on the active surface;
a first chip, connected to the substrate, comprising
a first surface, adjacent to the active surface of the substrate,
a second patterned conductive layer, located on the first surface,
a second surface, wherein the second patterned conductive layer is electrically connected to the first patterned conductive layer of the substrate; and
a first adhesive layer, filled between the first chip and the substrate, covering the active surface of the substrate and all surfaces of the first chip besides the second surface,
wherein a vertical height of the first adhesive layer relative to the active surface of the substrate is equal to a vertical height of the second surface of the first chip relative to the active surface of the substrate.

19. The packaging structure of the wafer level chip as claimed in claim 18, wherein the second patterned conductive layer of the first chip is electrically connected to the first patterned conductive layer of the substrate through metal joint.

20. The packaging structure of the wafer level chip as claimed in claim 18, wherein the first adhesive layer further comprises a plurality of conductive particles, and the second patterned conductive layer of the first chip is electrically connected to the first patterned conductive layer of the substrate through the conductive particles.

21. The packaging structure of the wafer level chip as claimed in claim 18, wherein a thickness of the first chip is smaller than or equal to 100 µm and greater than 5 µm.

22. The packaging structure of the wafer level chip as claimed in claim 18, wherein the first chip further comprising
an interconnection structure, and
a third patterned conductive layer, located on the second surface,
wherein the third patterned conductive layer is electrically connected to the second patterned conductive layer of the first surface through the interconnection structure.

23. The packaging structure of the wafer level chip as claimed in claim 22, wherein the interconnection structure is a through-silicon-via.

24. The packaging structure of the wafer level chip as claimed in claim 22, further comprises a second chip connected to the first chip, the second chip comprising
a third surface, adjacent to the second surface of the first chip;
a fourth patterned conductive layer, located on the third surface; and
a fourth surface, wherein the fourth patterned conductive layer is electrically connected to the third patterned conductive layer of the first chip.

25. The packaging structure of the wafer level chip as claimed in claim 22, further comprising a second adhesive layer filled between the first chip and the second chip, wherein a vertical height of the second adhesive layer relative to the active surface of the substrate is equal to a vertical height of the fourth surface of the second chip relative to the active surface of the substrate, and the second adhesive layer covers all surfaces of the second chip besides the fourth surface.

26. The packaging structure of the wafer level chip as claimed in claim 25, wherein materials of the second adhesive layer and the first adhesive layer are the same.

* * * * *